(12) United States Patent
Bechtel et al.

(10) Patent No.: US 7,982,229 B2
(45) Date of Patent: Jul. 19, 2011

(54) LIGHT EMITTING DEVICE WITH CONVERSION STRUCTURE

(75) Inventors: Hans-Helmut Bechtel, Roetgen (DE); Wolfgang Busselt, Roetgen (DE); Silvia Golsch, Wurselen (DE); Thomas Justel, Witten (DE); Peter Schmidt, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 632 days.

(21) Appl. No.: 11/719,244

(22) PCT Filed: Nov. 9, 2005

(86) PCT No.: PCT/IB2005/053683
§ 371 (c)(1),
(2), (4) Date: May 14, 2007

(87) PCT Pub. No.: WO2006/054203
PCT Pub. Date: May 26, 2006

(65) Prior Publication Data
US 2009/0078949 A1 Mar. 26, 2009

(30) Foreign Application Priority Data
Nov. 18, 2004 (EP) .................................. 04105908

(51) Int. Cl.
*H01L 33/00* (2010.01)
(52) U.S. Cl. .................................. 257/98; 257/E33.067
(58) Field of Classification Search .................... 257/88, 257/89, 98, 99, E33.061, E33.067; 313/111, 313/112, 501, 502; 362/543, 545, 555, 558
See application file for complete search history.

(56) References Cited

U.S. PATENT DOCUMENTS

| | | | |
|---|---|---|---|
| 5,590,147 A * | 12/1996 | Hobbs et al. | 372/75 |
| 5,982,092 A | 11/1999 | Chen | |
| 2001/0036083 A1 | 11/2001 | Weber et al. | |
| 2002/0080501 A1 * | 6/2002 | Kawae et al. | 359/799 |
| 2002/0113244 A1 | 8/2002 | Barnett et al. | |
| 2004/0145308 A1 | 7/2004 | Rossner et al. | |

FOREIGN PATENT DOCUMENTS

| | | |
|---|---|---|
| EP | 1139440 | 10/2001 |
| EP | 1418629 | 5/2004 |
| JP | 7176794 | 7/1995 |
| WO | 9812757 | 3/1998 |
| WO | 2004021460 A2 | 3/2004 |

* cited by examiner

*Primary Examiner* — Minh-Loan T Tran
*Assistant Examiner* — Vongsavanh Sengdara (57) ABSTRACT

The invention relates to a light-emitting device comprising a conversion structure and one or several LEDs (40), which emit light into the conversion structure. The light is then converted and emitted with a high radiant flux.

18 Claims, 5 Drawing Sheets

LIGHT EMITTING DEVICE WITH CONVERSION STRUCTURE

This invention relates to the field of light emitting devices that include LEDs. LEDs used for illumination typically emit incoherent light within a range of 30 to 60 lumen. This means that e.g., for an automobile headlamp, at least 20 to 40 LEDs are needed in order to replace a conventional halogen-lamp. Even with the next generation of LEDs to come, it is estimated that the number of LEDs needed will only be reduced by a maximum of 50%. On the other hand, it is not possible to "pack" or arrange LEDs without having a certain amount of distance between the LEDs, since the LEDs get hot during continuous operation. This means that the optics of a lamp with closely packed LEDs would become very large, or that each LED would require its own lamp optic. Furthermore, it is not possible to "concentrate" the light emitted by the LEDs by optical means, such as mirrors etc.

It is therefore an object of the present invention to provide a light-emitting device, which emits light with a high lumen flux from a small volume, i.e. high luminance.

This object is achieved by a light-emitting device comprising at least one LED which emits light in the wavelength range of $\geq 220$ nm to $\leq 550$ nm and at least one conversion structure placed towards the at least one LED without optical contact, which converts at least partly the light from the at least one LED to light in the wavelength range of $\geq 300$ nm to $\leq 1000$ nm, characterized in that the at least one conversion structure has a refractive index n of $\geq 1.5$ and $\leq 3$ and the ratio A:E is $\geq 2:1$ and $\leq 50000:1$, where A and E are defined as follows:

the at least one conversion structure comprises at least one entrance surface, where light emitted by the at least one LED can enter the conversion structure and at least one exit surface, where light, preferably light used in the optical system of the lamp, can exit the at least one conversion structure, each of the at least one entrance surfaces having an entrance surface area, the entrance surface area(s) being numbered $A_1 \ldots A_n$ and each of the at least one exit surface(s) having an exit surface area, the exit surface area(s) being numbered $E_1 \ldots E_n$ and the sum of each of the at least one entrance surface(s) area(s) A being $A = A_1 + A_2 \ldots + A_n$ and the sum of each of the at least one exit surface(s) area(s) E being $E = E_1 + E_2 \ldots + E_n$.

By doing so, it is possible to realize a lamp combining a high light flux with a greatly increased luminance, as compared to LEDs.

According to the invention, the light-emitting device comprises at least one LED, which emits light in the wavelength range of $\geq 220$ nm and $\leq 550$ nm. LEDs with an emittance in this wavelength range have proven themselves in practice. According to a preferred embodiment of the present invention, the light-emitting device comprises at least one LED, which emits light in the wavelength range of $\geq 250$ nm and $\leq 500$ nm, more preferably $\geq 300$ nm and $\leq 480$ nm.

According to the invention, the conversion structure comprises at least one exit surface, where light can exit the conversion structure. In order to enhance this, the at least one exit surface is equipped, according to a preferred embodiment of the present invention, with a refractive and/or diffractive structure or surface. This means that the at least one exit surface is equipped with a scattering structure 200a, a pyramid-like structure 200b, a microlens structure 200c or a compound parabolic concentrator (CPC) 200d, as illustrated in FIGS. 6A-6D. The exit surface may contain one or a plurality of the indicated structures. The geometry of the exit structure can also be used to direct the emitted light from the exit surface to fit any requirement of an application.

In order to enhance this process, according to a preferred embodiment of the present invention, the at least one entrance surface has a roughness Ra of $\geq 1$ nm and $\leq 500$ nm, preferably $\geq 10$ nm and $\leq 100$ nm and more preferably $\geq 20$ nm and $\leq 40$ nm. By virtue thereof, it is possible indeed to concentrate light at the exit surface E of the light conversion structure.

According to the invention, the conversion structure(s) and the LED(s) are placed towards each other without optical contact. This feature is especially important in order to reach the desired light flux. Optical contact in the sense of the present invention means, in particular, that the index of refraction of the conversion structure $n_c$ is higher than the index of refraction $n_m$ of the medium, the structures, the devices and/or the LEDs physically contacting the conversion structure.

According to a preferred embodiment of the present invention, the LED(s) is (are) in direct physical contact with the conversion structure(s), but each has a lower index of refraction than the conversion structure(s).

However, according to another preferred embodiment of the present invention, the LED(s) and the conversion structure(s) are placed at a distance from each other. In this case, preferably, the distance between the conversion structure(s) and the LED(s) is $\geq 1$ µm and $\leq 100$ mm, preferably $\geq 100$ µm and $\leq 10$ mm and more preferably $\geq 1$ mm and $\leq 5$ mm.

Besides the optical function of the separation of the LEDs and the conversion layer, it is also advantageous in accordance with a further preferred embodiment of the present invention to have a thermal decoupling of the conversion layer and the LEDs. In most applications, the efficiency of the conversion process decreases significantly for temperatures well above 100° C. In another preferred embodiment of this invention, special cooling means are applied to the light-emitting device to transport heat generated within the conversion layer and the LED(s) to a heat sink outside the device, the LED(s) and the conversion structure(s) being placed at a distance from each other, preferably as described above. This cooling can be realized by forced air blowing and/or by liquid cooling, i.e., pumping a liquid around the conversion layer. In this preferred embodiment of the present invention, the cooling means is therefore a liquid, preferably selected out of a group comprising Water-, Oil-, Propylene-, Ethylene-, Glycol-based systems and mixtures thereof. In the latter case, the refractive index of the liquid should be as low as possible to prevent light extraction of emitted light through the surface A of the conversion layer. The difference of the refractive index of the conversion layer $n_c$ and the liquid $n_1$ should be $0.1 \leq n_c - n_1 \leq 3$, preferably $0.3 \leq n_c - n_1 \leq 2.5$ and more preferably $0.5 \leq n_c - n_1 \leq 2$.

According to the invention, the light that enters the conversion structure is at least partly converted to light in the wavelength range of $\geq 300$ nm and $\leq 1000$ nm. By doing so, the light emitting device will emit light in a wavelength range, which is suitable for a broad variety of applications. According to a preferred embodiment of the present invention, the light that enters the conversion structure is at least partly converted to light in the wavelength range of $\geq 350$ nm and $\leq 880$ nm, more preferably $\geq 380$ nm and $\leq 780$ nm.

According to the invention, the conversion structure comprises at least one exit surface, where light can exit the conversion structure. In order to enhance this, the at least one exit surface is equipped, according to a preferred embodiment of the present invention, with a refractive and/or diffractive structure or surface. This means that the at least one exit surface is equipped with a scattering structure, a pyramid-like structure, a microlens structure or a compound parabolic concentrator (CPC). The exit surface may contain one or a plurality of the indicated structures. The geometry of the exit structure can also be used to direct the emitted light from the exit surface to fit any requirement of an application.

According to the invention, each of the at least one entrance surfaces has an entrance surface area, the entrance surface area(s) being numbered $A_1 \ldots A_n$ and each of the at least one exit surfaces has an exit surface area, the exit surface area(s) being numbered $E_1 \ldots E_n$ and the sum of each of the at least one entrance surface area(s) $A_n$ being $A = A_1 + A_2 \ldots + A_n$ and the sum of each of the at least one exit surface area(s) $E_n$ being $E = E_1 + E_2 \ldots + E_n$ and the ratio A:E, A and E being as defined above, being $\geq 2:1$ and $\leq 50000:1$.

This feature is one of the particularly important features of the invention. By virtue thereof, the light flux of the LED can be set within the preferred and desired range. According to a preferred embodiment of the present invention, the ratio A:E, A and E being as defined above, is $\geq 5:1$ and $\leq 5000:1$, more preferably $\geq 10:1$ and $\leq 3000:1$, yet more preferably $\geq 20:1$ and $\leq 1000:1$, and most preferably $\geq 50:1$ and $\leq 500:1$.

According to the invention, the at least one conversion structure has a refractive index n of $\geq 1.5$ and $\leq 3$. By virtue thereof, it can be easily achieved that the efficacy of the LED is within a desired range. Especially, by setting the refractive index as described above, the light that enters the conversion structure as described above will undergo total reflection at the sides/surfaces of the conversion structure, which are no exit surfaces. The fraction of the light from the LEDs which is emitted through the exit surface (possibly after conversion) of the conversion structure, compared to the totally emitted light, can be as high as $$1 - \frac{1}{2n^2},$$

with n being the refractive index of the conversion structure. This results in a very highly efficient light-emitting device. Preferably, the at least one conversion structure has a refractive index n of $\geq 1.7$ and $\leq 2.8$, more preferably $\geq 1.8$ and $\leq 2.6$.

According to a preferred embodiment of the present invention, the conversion structure has a transmittance for emitted light of $\geq 0.8$ and $\leq 1$. This greatly enhances the efficacy of the light-emitting device. Preferably, the transmittance of the conversion structure is $\geq 0.9$ and $\leq 1$, more preferably $\geq 0.95$ and $\leq 1$.

According to a preferred embodiment of the present invention, the relation of the quantum efficiency at a temperature T to the quantum efficiency at 20° C. (thermal quenching) of the conversion structure is $\geq 70\%$ and $\leq 100\%$ at 100° C., preferably $\geq 80\%$ and $\leq 100\%$ at 100° C. and most preferably $\geq 90\%$ and $\leq 100\%$ at 100° C.

According to a preferred embodiment of the present invention, the temperature at which the quantum efficiency of the conversion layer is reduced to 50% compared to the quantum efficiency at room temperature, (=$TQ_{50\%}$-value), is $\geq 120°$ C. and $\leq 400°$ C., preferably 150° C. $\leq TQ_{50\%} \leq 350°$ C. and more preferably 180° C. $\leq TQ_{50\%} \leq 300°$ C.

According to a preferred embodiment of the present invention, $\geq 50\%$ and $\leq 100\%$, preferably $\geq 70\%$ and $\leq 100\%$ and most preferably $\geq 90\%$ and $\leq 100\%$ of the light from the LEDs is absorbed by the conversion structure and converted into a wavelength longer than the LED emission wavelength. The emission wavelengths of the LEDs and the light emitted by the conversion structure are called the mean wavelength of the emission spectra for LED and the conversion structure, respectively.

According to a preferred embodiment of the present invention, the luminance at the exit surface of the conversion structure $L_{exit}$ is $\geq 0.1$ and $\leq 300$ times the average LED luminance $L_{LED}$ used for the light emitting device, more preferably $1*L_{LED} \leq L_{exit} \leq 100*L_{LED}$ and most preferably $3*L_{LED} \leq L_{exit} \leq 40*L_{LED}$. In the sense of the present invention, the average LED luminance is in particular the lumen fraction per steradian emitted by the LED assembly divided by the LED assembly area.

According to a preferred embodiment of the present invention, the conversion structure is essentially made of a monocrystalline material and/or monolithic polycrystalline material, which is preferably optically isotropic and/or non-birefringent. These materials fulfill the requirements needed for a suitable conversion structure as used within the present invention.

According to a preferred embodiment of the present invention, the conversion structure is essentially made of material selected from the group comprising $(M^I_{1-x-y}M^{II}_xM^{III}_y)_3(M^{IV}_{1-z}M^V_z)_5O_{12}$— where $M^I$ is selected from the group comprising Y, Lu or mixtures thereof, $M^{II}$ is selected from the group comprising Gd, La, Yb or mixtures thereof, $M^{III}$ is selected from the group comprising Tb, Pr, Ce, Er, Nd, Eu or mixtures thereof, $M^{IV}$ is Al, $M^V$ is selected from the group comprising Ga, Sc or mixtures thereof, and $0 \leq x \leq 1$, $0 \leq y \leq 0.1$, $0 \leq z \leq 1$, $(M^I_{1-x-y}M^{II}_xM^{III}_y)_2O_3$— where $M^I$ is selected from the group comprising Y, Lu or mixtures thereof, $M^{II}$ is selected from the group comprising Gd, La, Yb or mixtures thereof, $M^{III}$ is selected from the group comprising Tb, Pr, Ce, Er, Nd, Eu, Bi, Sb or mixtures thereof, and $0 \leq x \leq 1$, $0 \leq y \leq 0.1$, $(M^I_{1-x-y}M^{II}_xM^{III}_y)S_{1-z}Se_z$— where $M^I$ is selected from the group comprising Ca, Sr, Mg, Ba or mixtures thereof, $M^{II}$ is selected from the group comprising Ce, Eu, Mn, Tb, Sm, Pr, Sb, Sn or mixtures thereof, $M^{III}$ is selected from the group comprising K, Na, Li, Rb, Zn or mixtures thereof, and $0 \leq x \leq 0.01$, $0 \leq y \leq 0.05$, $0 \leq z \leq 1$, $(M^I_{1-x-y}M^{II}_xM^{III}_y)O$— where $M^I$ is selected from the group comprising Ca, Sr, Mg, Ba or mixtures thereof, $M^{II}$ is selected from the group comprising Ce, Eu, Mn, Tb, Sm, Pr or mixtures thereof, $M^{III}$ is selected from the group comprising K, Na, Li, Rb, Zn or mixtures thereof, and $0 \leq x \leq 0.1$, $0 \leq y \leq 0.1$, $(M^I_{2-x}M^{II}_xM^{III}_2)O_7$— where $M^I$ is selected from the group comprising La, Y, Gd, Lu, Ba, Sr or mixtures thereof, $M^{II}$ is selected from the group comprising Eu, Tb, Pr, Ce, Nd, Sm, Tm or mixtures thereof, $M^{III}$ is selected from the group comprising Hf, Zr, Ti, Ta, Nb or mixtures thereof, and $0 \leq x \leq 1$, $(M^I_{1-x}M^{II}_xM^{III}_{1-y}M^{IV}_y)O_3$— where $M^I$ is selected from the group comprising Ba, Sr, Ca, La, Y, Gd, Lu or mixtures thereof, $M^{II}$ is selected from the group comprising Eu, Tb, Pr, Ce, Nd, Sm, Tm or mixtures thereof, $M^{III}$ is selected from the group comprising Hf, Zr, Ti, Ta, Nb or mixtures thereof, and $M^{IV}$ is selected from the group comprising Al, Ga, Sc, Si or mixtures thereof, and $0 \leq x \leq 0.1$, $0 \leq y \leq 0.1$, or mixtures thereof.

According to a preferred embodiment of the present invention, the conversion structure comprises at least one further surface which is neither an exit surface nor an entrance surface, and wherein at least one, but preferably all of said further surface(s) are provided with a reflective coating, preferably a mirror or a dielectric coating or a mixture thereof. By virtue thereof, the efficacy of the conversion structure(s) and the light-emitting device can be enhanced further. The mirror is preferably applied by sputtering or vacuum evaporation directly on the at least one further surface which is neither an exit surface nor an entrance surface. The mirror material is preferably selected from a group comprising silver, aluminum and/or mixtures thereof. The thickness of the mirror is preferably $\geq 50$ nm and $\leq 1000$ nm According to a preferred embodiment of the present invention, the LEDs arranged to irradiate the entrance surfaces of the conversion layer are mounted either individually or in a die package on a single supporting plate serving as a heat conductor and providing the electrical contacts for operation. The one or more supporting plates may also contain active electronic elements for LED protection, operation and control. In addition, according to a preferred embodiment of the present invention, the LED dies on a supporting plate are covered with optical structures to optimise the light output of the LED dies.

In a further preferred embodiment of the present invention, LEDs are mounted on a supporting plate with a packing density $\geq 0.05$ and $\leq 0.5$, preferably $\geq 0.1$ and $\leq 0.3$. The packing density is the ratio of the sum of the LED die surface areas to the surface area of the supporting plate. By doing so, it is possible to realize a light emitting device having a particularly high lumen flux and superior luminance at a high power efficiency, which is achieved by effective cooling of the LEDs, thus keeping the junction temperature below the specified values of the LEDs.

A light emitting device according to the present invention may be used in a broad variety of systems and/or applications, including one or more of the following:

household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, and decorative lighting systems, portable systems and automotive applications.

The aforementioned components, as well as the claimed components and the components to be used in accordance with the invention in the described embodiments, are not subject to any special exceptions with respect to their size, shape, material selection and technical concept, so that the selection criteria known in the pertinent field can be applied without limitations.

Additional details, features, characteristics and advantages of the object of the invention are disclosed in the subclaims, figures, examples and the following description of the respective figures and examples, which—in an exemplary fashion—show several preferred embodiments of a light emitting device according to the invention.

Figure 1:
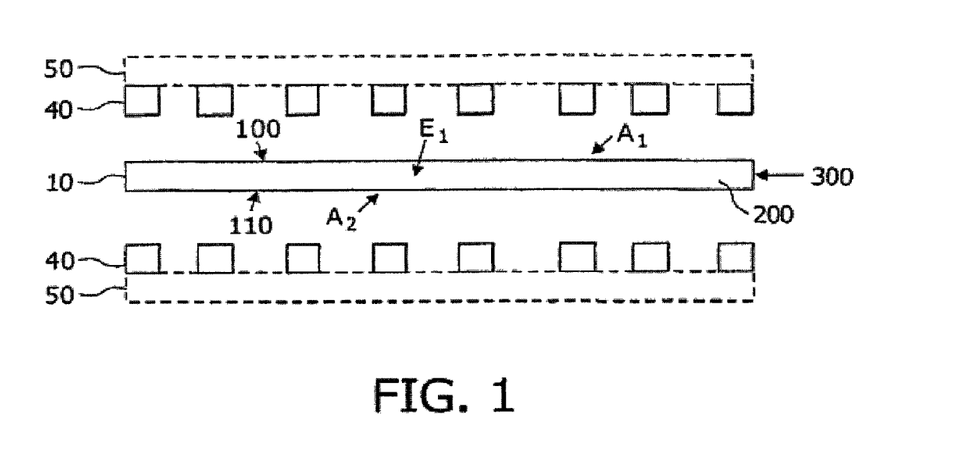
FIG. 1 shows a schematic cross-sectional partial view of a light-emitting device according to a first embodiment.

FIG. 1 shows a schematic cross-sectional partial view of a light-emitting device 1 according to a first embodiment. As can be seen from FIG. 1, the conversion structure 10 has a layer-like structure resembling a cuboid. It comprises two entrance surfaces, 100 and 110 (which cannot be seen in FIG. 1 due to the perspective) and one exit surface 200. The surface area of the two entrance surfaces would be $A_1$ and $A_2$, respectively, resulting in A being $A_1+A_2$. Since there is only one exit surface with an exit surface area $E_1$, the numeral E, being the sum of each of the at least one exit surface area(s), would simply be $E=E_1$. The ratio of A:E is set to be $\geq 10:1$ and $\leq 10000:1$; in this example A:E would be approximately 30:1. However, it should be noted that the embodiment in FIG. 1 is highly schematic and the ratio may be different for other applications.

Further surfaces 300 (only one is indicated in FIG. 1, although there are three of them) are provided with a mirror, which cannot be seen in the FIG. 1 either. Within optical distance of the entrance surfaces 100 and 110, several LEDs 40 are provided, which emit light into the entrance surface. The LED may be provided on further parts, which are not part of this invention (indicated by the dotted lines and referred to by 50 and 60).

Figure 2:
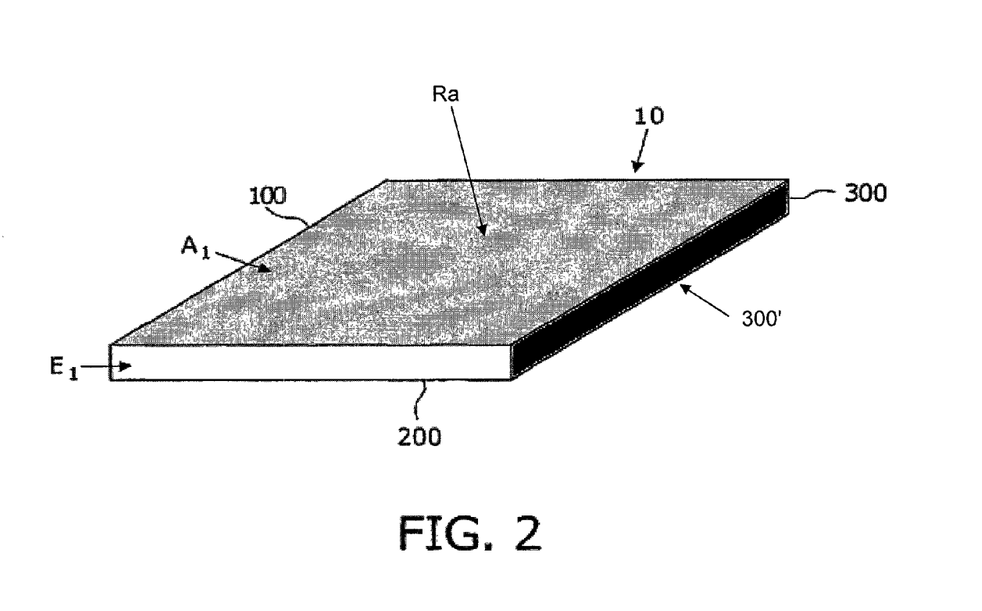
FIG. 2 shows a perspective view of the conversion structure of the light emitting device of FIG. 1.

FIG. 2 shows a perspective view of the conversion structure 10 of the light emitting device of FIG. 1. The further surfaces 300 (only one is indicated in FIG. 2, although there are three of them) are provided with a mirror 300'.

It should be noted that in this embodiment there are two entrance surfaces 100, 110 and only one exit surface 200. However, this is not to be construed in a limiting sense; the number of entrance surface(s) and exit surface(s) may be set arbitrarily within the present invention, as long as the ratio between A and E (A being the sum of the surface area(s) of the entrance surface(s), E being the sum of the exit surface area(s) of the exit surface(s), as described above) lies within the inventive range. In one embodiment of the present invention, the at least one entrance surface has a roughness Ra of $\geq 1$ nm and $\leq 500$ nm, preferably $\geq 10$ nm and $\leq 100$ nm and more preferably $\geq 20$ nm and $\leq 40$ nm. By virtue thereof, it is possible indeed to concentrate light at an exit surface E of the light conversion structure.

The embodiment of the present system shown in the figures according to the present invention may be used in a broad variety of systems and/or applications, including one or more of the following: household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems and automotive applications.

Figure 3:
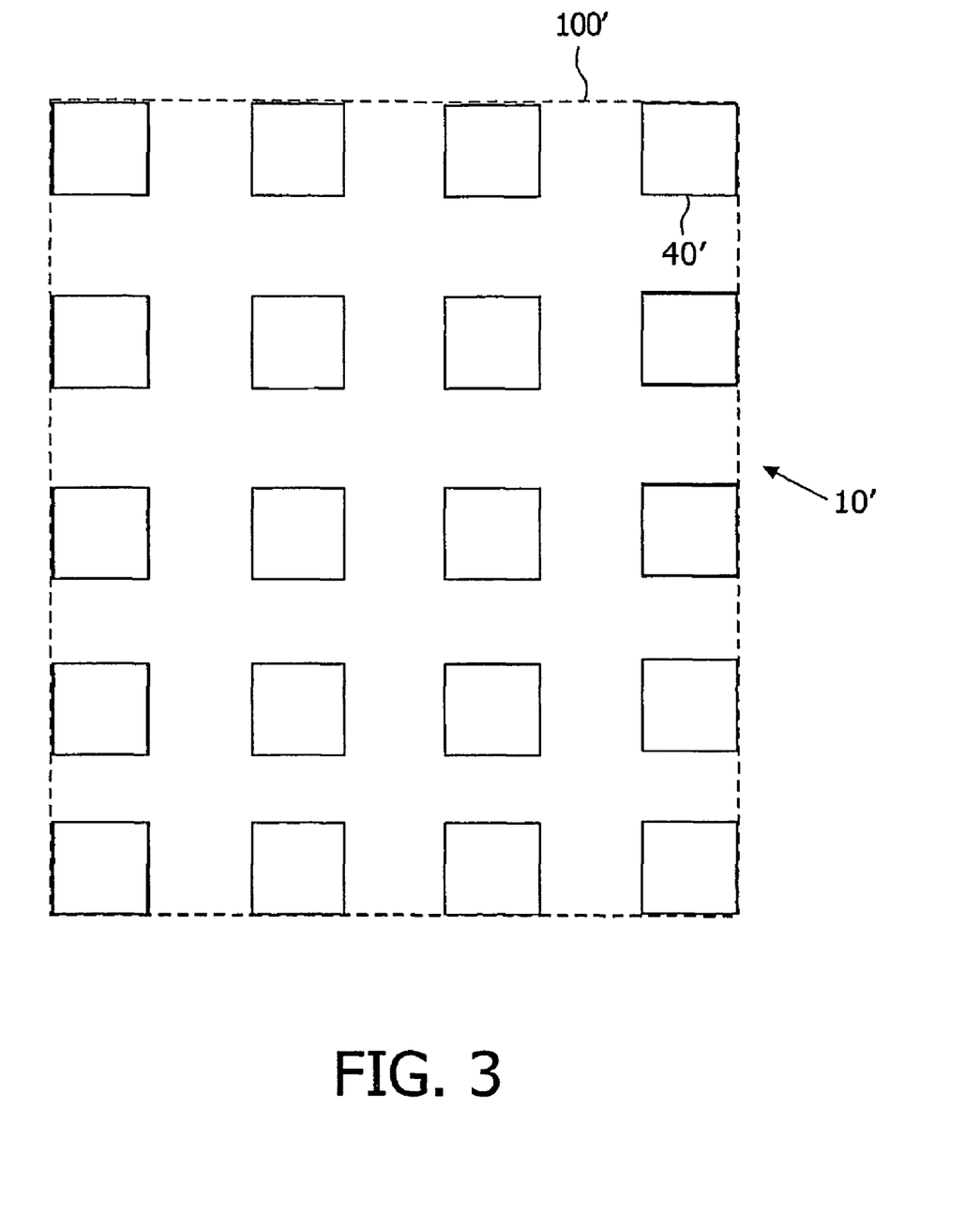
FIG. 3 shows a—very schematic—top view of several LEDs of a light emitting device according to a second embodiment of the invention.

FIG. 3 shows a—very schematic—top view of several LEDs 40' of a light emitting device according to a second embodiment of the invention. The further parts on which the LEDs may be mounted and/or provided have been omitted. For illustration, the corresponding entrance surface 100' of the conversion structure 10' is shown. As can be seen from FIG. 3, the LEDs 40' may be provided in a grid-like structure with enough room between them in order to avoid that the LEDs may get too hot. The LEDs 40' are mounted with a packing density $\geq 0.05$ and $\leq 0.5$.

Figure 4:
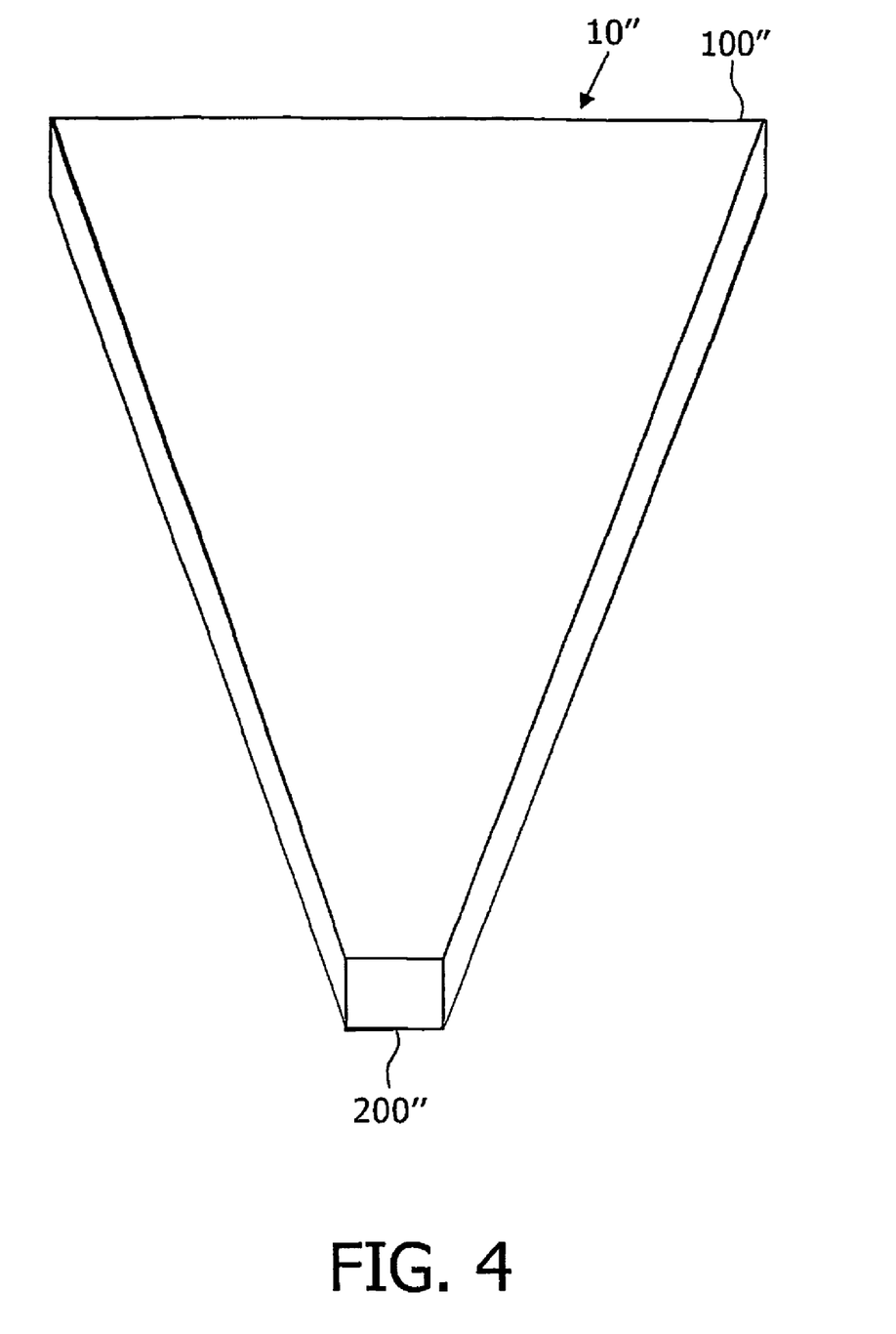
FIG. 4 shows a perspective view of the conversion structure of a light emitting device according to a third embodiment.

FIG. 4 shows a perspective view of the conversion structure 10" with an entrance surface 100" and an exit surface 200" according to a third embodiment of the invention. In order to even enhance the ratio between A and E (A being the sum of the surface area(s) of the entrance surface(s), E being the sum of the exit surface area(s) of the exit surface(s), as described above), the conversion structure may be set to be a different shape than a cuboid, with the entrance surface having somewhat the shape of a trapezoid. By doing so, the light flux may be even enhanced, which may be advantageous for some applications.

The lighting device according to the invention is—in a merely exemplary embodiment—furthermore illustrated by the following example:

EXAMPLE 1

1000 ml of a 0.5279 M solution of $Lu(NO_3)_3(H_2O)_6$ (made by dissolution of $Lu_2O_3$ (Rhodia) in nitric acid p.a.) are mixed with 4241.4 ml of a 0.2089 M solution of $NH_4Al(SO_4)_2(H_2O)_{12}$ (Alfa Aesar), and 2.320 g $Pr(NO_3)_3(H_2O)_6$ (Aldrich). Then, a solution of 1123 g $(NH)HCO_3$ in 8000 ml demineralised water is added slowly while stirring (80 ml/min). The precipitate is washed with water, dried and calcined at 1100° C. for 3 hrs under CO atmosphere.

The ceramic precursor powder is then milled with 2 mm alumina balls in ethanol for 4 hrs, dried and granulated with PVA binder. Ceramic green bodies are formed by cold uniaxial pressing (3.2 kbar). Firing is done by sinter-HIP at 1750° C. (2 hrs pressureless sintering+10 hrs sintering in argon at 1 kbar). Out of this starting material, a conversion structure with a "box-like"-shape having dimensions of 4×30×1 $mm^3$ is formed, the index of refraction of the conversion structure being approx. 1.8.

The conversion structure was then shaped and provided as described above in such a way that both 4×30 $mm^2$ surfaces were designed as entrance surfaces, whereas one 4×1 $mm^2$ surface was designed as an exit surface. The conversion structure was then post-annealed at 1250° C. for 12 hrs in air.

The other surfaces were provided with mirrors. This resulted in an A of 240 $mm^2$, an E of 4 $mm^2$, thus in an A:E ratio of 60:1; A and E being defined as described above.

The conversion structure was then mounted in a 5×35×8 $mm^3$ box with one 5×8 $mm^2$ side open. Both 5×35 $mm^2$ sides carry 20 1 $mm^2$ blue emitting LEDs, connected in parallel and in series to an appropriate external power supply. With the LEDs operated together at 40 W electrical power input, the lumen flux at the exit surface of the ceramic is 15 $MCd/m^2$ at a total flux of 350 lumen.

Figure 5:
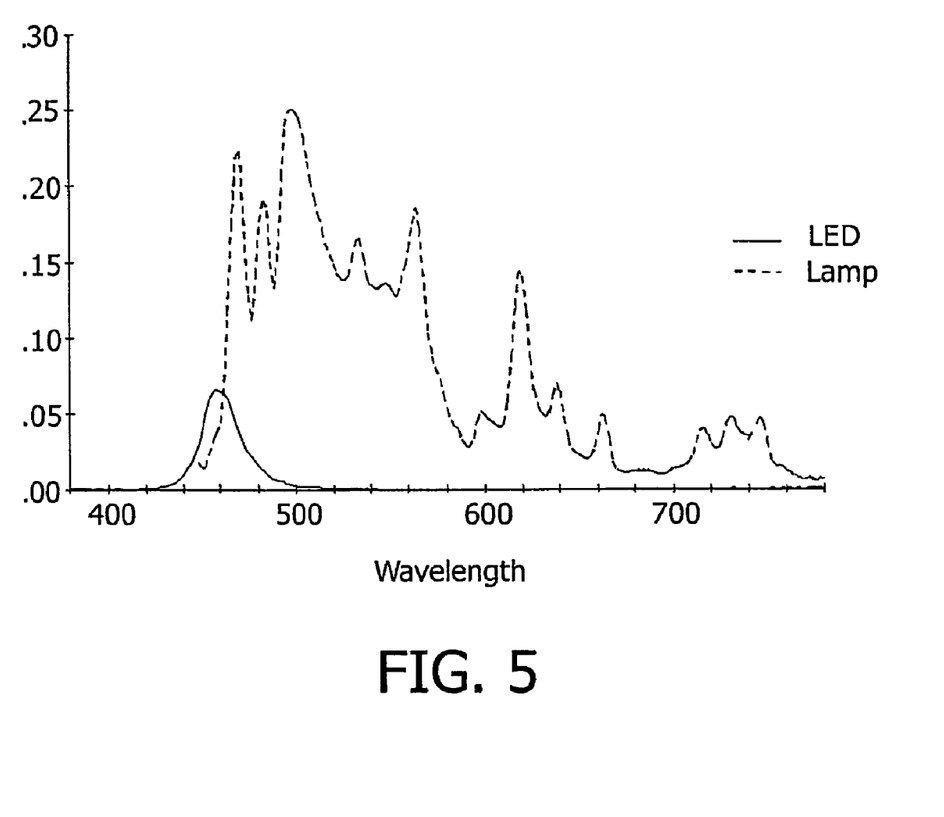
FIG. 5 is a graph showing the emission spectrum of a light emitting device and a LED used in the light emitting device according to Example 1.
Figure 6A:
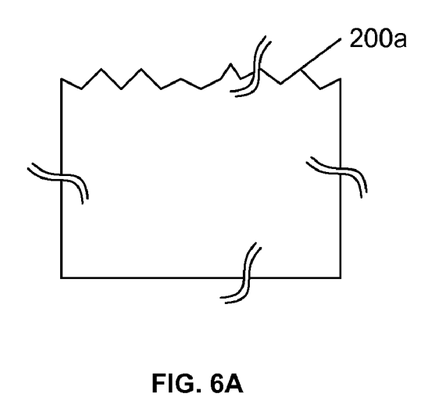
FIGS. 6A-6D illustrate example exit surface structures.
Figure 6B:
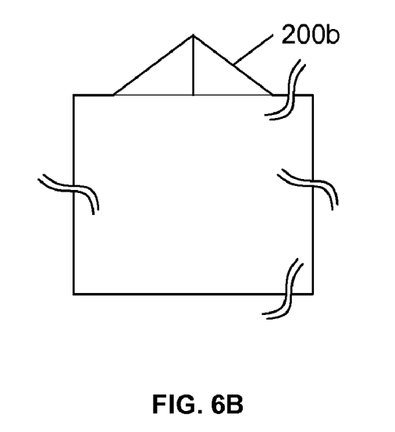
Figure 6C:
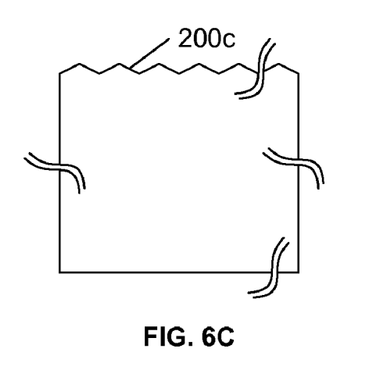
Figure 6D:
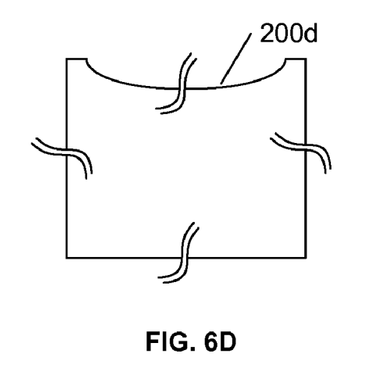

FIG. 5 shows the emission spectra of a light emitting device which was made according to the example, and an emission spectrum of one of the employed LEDs. It can be seen that a very broad spectrum over the desired wavelength area can be reached, although the different LEDs have only a small emission spectrum covering less than 100 nm with a maximum around 450 nm.

The invention claimed is:

1. A light emitting device comprising an LED which emits light in the wavelength range of $\geq 220$ nm to $\leq 550$ nm and a conversion structure placed towards the LED without optical contact, which converts at least partly the light from the LED and emits incoherent light in the wavelength range of $\geq 300$ nm to $\leq 000$ nm, wherein the conversion structure has a refractive index n of $\geq 1.5$ and $\leq 3$ and a ratio A:E is $\geq 2:1$ and $\leq 50000:1$,
   wherein the conversion structure comprises an entrance surface, where light emitted by the LED can enter the conversion structure and an exit surface, where light can exit the conversion structure,
   the entrance surface having an entrance surface area A, the exit surface having an exit surface area E.

2. The light emitting device according to claim 1, wherein at least 80% of the light emitted within the conversion structure exits through the exit surface.

3. The light emitting device according to claim 1, wherein the entrance surface area of the conversion structure has an average surface roughness of $\geq 1$ nm and $\leq 500$ nm.

4. The light emitting device according to claim 1, wherein thermal quenching (TQ) of the conversion structure is $\geq 70\%$ and $\leq 100\%$ at 100° C. or $TQ_{50\%}$-value is $\geq 120°$ C. and $\leq 400°$ C.

5. The light emitting device according to claim 1, wherein $\geq 50\%$ and $\leq 100\%$ of the light that enters the conversion structure from the LED is converted by the conversion structure.

6. The light emitting device according to claim 1, wherein luminance at the exit surface of the conversion structure $L_{exit}$ is $\geq 0.1$ and $\leq 300$ times an average LED luminance $L_{LED}$ used for the light emitting device.

7. The light emitting device according to claim 1, wherein the conversion structure is essentially made out of a monocrystalline material or a cubic monolithic polycrystalline material.

8. The light emitting device according to claim 1, wherein the conversion structure is essentially made of material selected from the group consisting of:
   $(M^I_{1-x-y}M^{II}_xM^{III}_y)_3(M^{IV}_{1-z}M^V_z)_5O_{12}$— where $M^I$ is selected from the group consisting of: Y, Lu or mixtures thereof, $M^{II}$ is selected from the group consisting of: Gd, La, Yb or mixtures thereof, $M^{III}$ is selected from the group consisting of: Tb, Pr, Ce, Er, Nd, Eu or mixtures thereof, $M^{IV}$ is Al, $M^V$ is selected from the group consisting of: Ga, Sc or mixtures thereof, and $0 \leq x \leq 1$, $0 \leq y \leq 0.1$, $0 \leq z \leq 1$,
   $(M^I_{1-x-y}M^{II}_xM^{III}_y)_2O_3$— where $M^I$ is selected from the group consisting of: Y, Lu or mixtures thereof, $M^{II}$ is selected from the group consisting of: Gd, La, Yb or mixtures thereof, $M^{III}$ is selected from the group consisting of: Tb, Pr, Ce, Er, Nd, Eu, Bi, Sb or mixtures thereof, and $0 \leq x \leq 1$, $0 \leq y \leq 0.1$,
   $(M^I_{1-x-y}M^{II}_xM^{III}_y)S_{1-z}Se_z$— where $M^I$ is selected from the group consisting of: Ca, Sr, Mg, Ba or mixtures thereof, $M^{II}$ is selected from the group consisting of: Ce, Eu, Mn, Tb, Sm, Pr, Sb, Sn or mixtures thereof, $M^{III}$ is selected from the group consisting of: K, Na, Li, Rb, Zn or mixtures thereof, and $0 \leq x \leq 0.01$, $0 \leq y \leq 0.05$, $0 \leq z \leq 1$,
   $(M^I_{1-x-y}M^{II}_xM^{III}_y)O$— where $M^I$ is selected from the group consisting of: Ca, Sr, Mg, Ba or mixtures thereof, $M^{II}$ is selected from the group consisting of: Ce, Eu, Mn, Tb, Sm, Pr or mixtures thereof, $M^{III}$ is selected from the group consisting of: K, Na, Li, Rb, Zn or mixtures thereof, and $0 \leq x \leq 0.1$, $0 \leq y \leq 0.1$,
   $(M^I_{2-x}M^{II}_xM^{III}_2)O_7$— where $M^I$ is selected from the group consisting of: La, Y, Gd, Lu, Ba, Sr or mixtures thereof, $M^{II}$ is selected from the group consisting of: Eu, Tb, Pr, Ce, Nd, Sm, Tm or mixtures thereof, $M^{III}$ is selected from the group consisting of: Hf, Zr, Ti, Ta, Nb or mixtures thereof, and $0 \leq x \leq 1$,
   $(M^I_{1-x}M^{II}_xM^{III}_{1-y}M^{IV}_y)O_3$— where $M^I$ is selected from the group consisting of: Ba, Sr, Ca, La, Y, Gd, Lu or mixtures thereof, $M^{II}$ is selected from the group consisting of: Eu, Tb, Pr, Ce, Nd, Sm, Tm or mixtures thereof, $M^{III}$ is selected from the group consisting of: Hf, Zr, Ti, Ta, Nb or mixtures thereof, and $M^{IV}$ is selected from the group consisting of: Al, Ga, Sc, Si or mixtures thereof, and $0 \leq x \leq 0.1$, $0 \leq y \leq 0.1$, or mixtures thereof.

9. The light emitting device according to claim 1, wherein the conversion structure comprises a further surface which is neither an exit surface nor an entrance surface, and wherein the further surface is provided with a reflective coating.

10. The light emitting device according to claim 1, wherein the entrance surface is one of a plurality of entrance surfaces having a corresponding plurality of entrance surface areas, and wherein said A is a summation of the plurality of entrance surface areas.

11. The light emitting device according to claim 1, wherein the exit surface is one of a plurality of exit surfaces having a corresponding plurality of exit surface areas, and wherein said E is a summation of the plurality of exit surface areas.

12. The light emitting device according to claim 1, wherein the ratio A:E is $\geq$5:1 and $\leq$5000:1.

13. The light emitting device according to claim 1, wherein the ratio A:E is $\geq$10:1 and $\leq$3000:1.

14. The light emitting device according to claim 1, wherein the ratio A:E is $\geq$20:1 and $\leq$1000:1.

15. The light emitting device according to claim 1, wherein the ratio A:E is $\geq$50:1 and $\leq$500:1.

16. The light emitting device according to claim 1, wherein the conversion structure has a refractive index n of $\geq$1.8 and $\leq$2.6.

17. The light emitting device according to claim 1, including a light scattering element that scatters the light from the light conversion element.

18. The light emitting device according to claim 1, wherein the exit surface includes at least one of: a scattering structure, a pyramid-like structure, a microlens structure, and a parabolic structure.

* * * * *